(12) United States Patent
Angus et al.

(10) Patent No.: US 7,755,078 B2
(45) Date of Patent: Jul. 13, 2010

(54) SILICON SINGLE ELECTRON DEVICE

(75) Inventors: Susan Angus, Middle Park (AU);
Andrew Steven Dzurak, Darlinghurst (AU); Robert Graham Clark, Balgowlah Heights (AU); Andrew Ferguson, Cambridge (GB)

(73) Assignee: Qucor Pty. Ltd. (AU)

( * ) Notice: Subject to any disclaimer, the term of this patent is extended or adjusted under 35 U.S.C. 154(b) by 40 days.

(21) Appl. No.: 12/157,757

(22) Filed: Jun. 13, 2008

(65) Prior Publication Data

US 2009/0309229 A1 Dec. 17, 2009

(51) Int. Cl.
*H01L 31/00* (2006.01)
(52) U.S. Cl. .............. 257/17; 257/23; 257/25; 257/E29.071; 977/774
(58) Field of Classification Search .......... 257/10–27, 257/104–106, E29.071; 977/774
See application file for complete search history.

(56) References Cited

U.S. PATENT DOCUMENTS

| 5,293,331 | A  | * | 3/1994  | Hart et al. ............. 365/185.02 |
| 6,512,282 | B2 | * | 1/2003  | Esaki .......................... 257/499 |
| 2006/0115640 | A1 | * | 6/2006  | Yodh et al. ................. 428/221 |
| 2006/0255368 | A1 | * | 11/2006 | Chae et al. .................. 257/213 |
| 2009/0163013 | A1 | * | 6/2009  | Song et al. ................. 438/591 |
| 2009/0184346 | A1 | * | 7/2009  | Jain ........................... 257/288 |

* cited by examiner

*Primary Examiner*—Evan Pert
*Assistant Examiner*—Scott R Wilson
(74) *Attorney, Agent, or Firm*—Wood, Phillips, Katz, Clark & Mortimer

(57) ABSTRACT

A silicon integrated circuit device comprising a near intrinsic silicon substrate in which there are one or more ohmic contact regions. An insulating layer lies above the substrate, and on top of the insulating layer is a lower layer of one or more aluminium gates. The surface of each of the lower gates is oxidised to insulate them from an upper aluminium gate that extends over the lower gates.

12 Claims, 8 Drawing Sheets

SILICON SINGLE ELECTRON DEVICE

TECHNICAL FIELD

This invention concerns a silicon integrated circuit device capable of creating quantum confinement of semiconductor dots, and capable of operation at radio frequencies (rf) as a sensitive electrometer. In another aspect the invention concerns a method of making the device. In one important embodiment the invention is a silicon single electron transistor (SET).

BACKGROUND ART

Recent achievements in controlling and measuring spin in GaAs-based semiconductor quantum dots[1-3] have been substantially facilitated by a tunable gate architecture. Electrostatically tunable barriers have also been used to create well-defined quantum dots in other low-dimensional systems, for example, semiconducting carbon nanotubes[4,5] and InAs nanowires[6].

Silicon is a particularly attractive material for use to investigate quantum dots, because of the expected long electron-spin coherence time. This is a result of the small spin-orbit coupling in silicon and the primarily spin-zero nuclear background.[7] However, single-electron spins have not yet been investigated in silicon quantum dots.

Recently, there has been considerable progress toward this goal. Coulomb blockade has been observed in etched Si/SiGe heterostructures,[8] and more recently, quantum dots have been defined in Si/SiGe using a Schottky split-gate technique.[9-12] Fixed tunnel barriers, such as local dopant modulation[13] or etching,[14,15] have been used to fabricate quantum dots in silicon-on-insulator material. Silicon nanowires have also been shown to confine a quantum dot, with the source and drain contacts forming the tunnel barriers.[16] Electrostatic tunnel barriers have been created using various double-gated structures.[17,18] Polysilicon gates have been used to define a single- and double-island single-electron transistor (SET) electrostatically.[19]

DISCLOSURE OF THE INVENTION

The invention is a silicon integrated circuit device comprising a silicon substrate in which there are one or more ohmic contact regions. An insulating layer lies above the substrate, and on top of the insulating layer is a lower layer of one or more aluminium gates. The surface of each of the lower gates is oxidised to insulate them from an upper aluminium gate that extends over the lower gates.

The device may be controlled by the voltages applied to the upper and lower gates. Voltage applied to the upper gate of this device is able to induce electrons into the channel to reduce resistance and enable conduction (like a MOSFET). However, voltage applied to the lower gates is able to locally deplete the channel beneath those gates to create tunnel barriers for controlling the flow of charge into and out of a central island region of the channel between the barriers (like an SET).

A quantum dot may be created within the device, in the central island region between two tunnel barriers. In this case the upper gate controls the number of electrons in the dot, and the lower gates control the coupling between the dot and the contact regions. Very small dots may be confined, which demonstrate quantum confinement. Excited states may then be observed in bias spectroscopy measurements.

Additional lower aluminium gates may be provided to create various desired functionalities. For example, by using three lower gates it is possible to produce a double quantum dot. Large formations of multiple devices can be arranged to perform, for instance, quantum computing applications.

In one arrangement the device has two ohmic contact regions at opposite ends of a selectively conductive channel. There are two lower gates and these are arranged transversely over the channel, and the upper gate extends longitudinally over the channel.

The device may be combined with an rf tank circuit. Further, the device may be tuned to resonance with the tank circuit, by variation of the voltages on the gates. In this configuration an rf carrier signal may be applied to the channel of the SET by the rf tank circuit, and the reflected power may then be mixed with the carrier frequency and measured using homodyne detection. In this mode of operation the device is capable of detecting the presence and movement of very small charges, down to a single electron, in or in the vicinity of the central island. The high bandwidth of the device means it can be used to measure electronic tunnel rates and other tunneling statistics.

The sensitivity of the SET is a result of the sharp transconductance of the Coulomb blockade oscillations. These oscillations occur when the charging energy of the island is greater than the thermal energy.

Sensitive electrometry enables the determination of the electronic properties of nanostructures such as quantum dots down to the limit of few electron occupancy.

The device has a wide range of operational temperatures, especially at low temperatures. For instance operation as a quantum dot is expected to be below 100 mK, although it may operate in this fashion at temperatures up to 1 K. As a silicon SET the device may operate at temperatures up to 4 K or even 10 K.

The ohmic contact regions may be made by diffusing phosphorus dopants into the substrate.

The insulating layer may be a 5 nm thick layer of $SiO_2$ gate oxide that is thermally grown on the surface of the substrate.

The two lower gates may be aluminium fabricated using electron beam lithography (EBL), thermal evaporation and liftoff. Each of the lower gates may be less than 30 nm wide, and the separation between them less than 40 nm.

The lower gates may be partially oxidized using plasma oxidation technique to create insulating layers over their surfaces. The surface insulating layer may be less than about 10 nm thick.

The upper gate may be aluminium, and it may be aligned to the lower gates during a second EBL stage, and again thermally evaporated and lifted off. The upper gate may be less than 100 nm wide, and could even be as narrow as 50 nm.

In a further aspect the invention concerns a method for fabricating the device, comprising the steps of:

Preparing a near intrinsic, high resistivity, silicon substrate, or silicon-on-insulator substrate.

Forming one or more ohmic contact regions in the substrate.

Thermally growing a layer of $SiO_2$ gate oxide on the substrate.

Fabricating a layer of one or more lower gates on top of the insulating oxide layer using electron beam lithography (EBL), thermal evaporation and liftoff.

Partially oxidising the lower gates using plasma oxidation technique to create insulating layers over their surfaces.

Fabricating an upper gate over the channel and lower gates during a second EBL stage, with thermal evaporation and liftoff.

Annealing the device.

BRIEF DESCRIPTION OF THE DRAWINGS

Examples of the invention will now be described with reference to the accompanying drawings, in which:

FIG. 7(a) is the DC conductance as a function of all gates applied together.

FIG. 7(b) is the reflected power (black) and change in resonant frequency (grey) as a function of all gates applied together.

FIG. 7(c) is DC conductance as a function of one of the barrier gates, $V_{B2}$.

FIG. 7(d) is reflected power as a function of one of the barrier gates, $V_{B2}$.

FIG. 8(a) is reflected power as a function of upper gate, $V_G$, at $V_{B1}$=0.716 V, $V_{B2}$=0.438 V.

FIG. 8(b) is resonant frequency response at two upper gate voltages, $V_G$=1.876V and $V_G$=1.879V, corresponding to a Coulomb blockade peak and trough respectively.

FIG. 8(c) is reflected power as a function of upper gate, $V_G$, at $V_{B1}$=0.702 V, $V_{B2}$=0.478 V.

FIG. 8(d) is reflected power as a function of both barrier gates, $V_{B1}$ and $V_{B2}$, at $V_G$=1.65 V, and with source-drain bias $V_{SD}$=11.0 mV.

FIG. 8(e) is Coulomb diamonds, that is reflected power as a function of source-drain bias, $V_{SD}$ and $V_G$.

BEST MODES OF THE INVENTION

Device Fabrication and Geometry

Figure 1A:
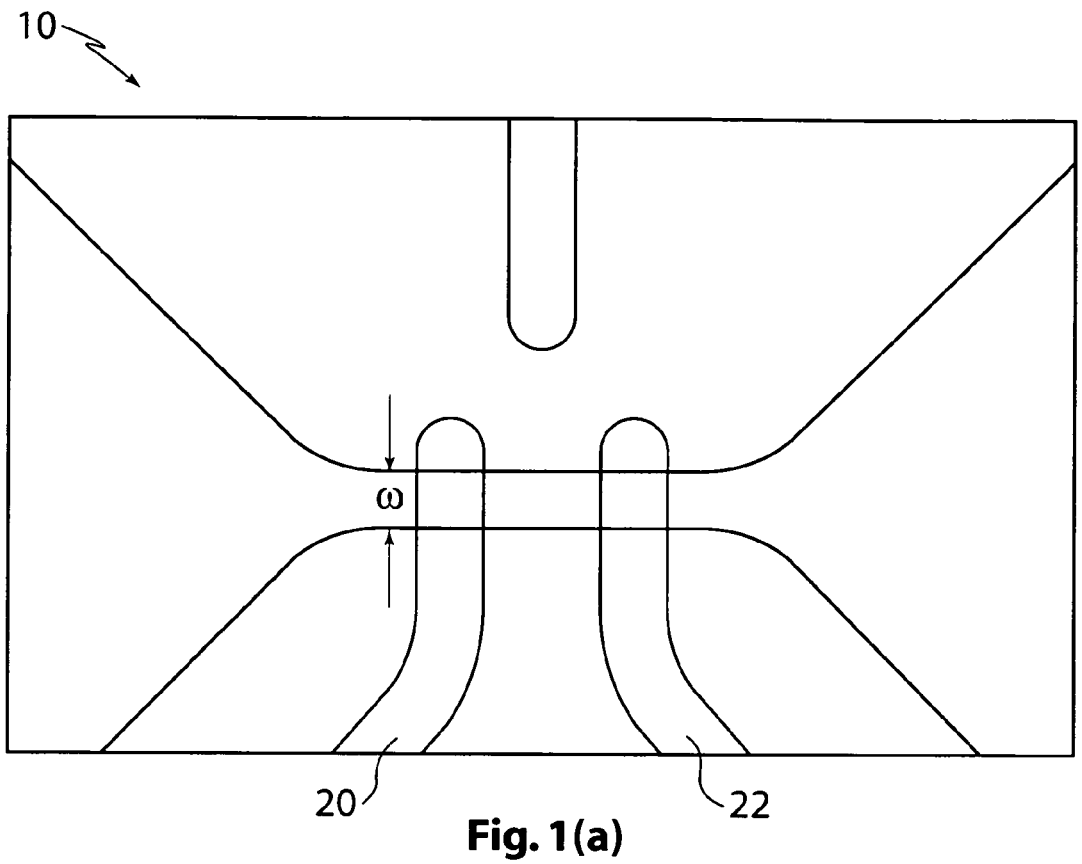
FIG. 1(a) is a schematic plan of a silicon device embodying the invention.

Referring first to FIGS. 1(a) and (b) the device 10 is seen to comprise a near intrinsic, high resistivity, silicon substrate 12. At either side of the device are regions 14 and 16 of phosphorus diffused n+ regions which provide ohmic contact regions for the device. A 5 nm thick layer of $SiO_2$ gate oxide 18 was thermally grown on the surface. On top of this insulating oxide layer 18 two lower gates 20 and 22 were fabricated using electron beam lithography (EBL), thermal evaporation and liftoff. Each of the lower gates 20 and 22 were less than 30 nm wide, and the separation between them d is less than 40 nm.

The lower gates were then partially oxidized using plasma oxidation technique to create insulating layers 24 and 26 over their surfaces respectively. In particular, the aluminium gates were exposed to a low-pressure oxygen plasma (0.15 mbar) for 3 min at a temperature of about 150° C. This forms a layer of oxide at the gates' surfaces that is a few nanometers thick.

An upper aluminium gate 28 was aligned to the lower gates during a second EBL stage, and again thermally evaporated and lifted off. The upper gate 28 can be made in a range of widths w, for instance between 50 nm and 100 nm wide, in any event it crosses over the top of the two lower gates 20 and 22.

The final processing step was a low-temperature-forming gas anneal, comprising 15 min at 400° C. in 95% $N_2$/5% $H_2$.

Slowly Varying DC Voltage Investigations

Figure 1B:
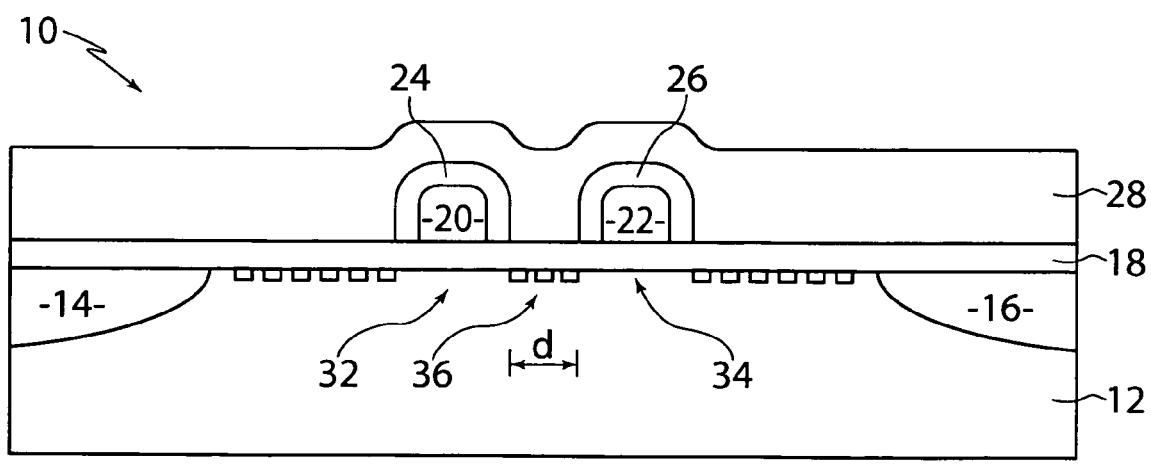
FIG. 1(b) is a schematic cross-section of the silicon device of FIG. 1.

The geometry described in FIG. 1 can be used, by applying an appropriate voltage $V_G$ to the upper gate 28, to induce an accumulation layer, that is a two-dimensional electron gas (2DEG), in the intrinsic silicon substrate 12 (like a MOSFET). Appropriate voltages, $V_1$ and $V_2$, on the two lower gates 20 and 22, can locally deplete electrons from below the two lower gates 20 and 22, as shown at 32 and 34, to form tunable tunnel barriers (like a SET). This in turn allows the electrostatic confinement of a small number of electrons in the central island 36 under the space between the lower gates 20 and 22. The confined silicon may form a quantum dot with a diameter of about 50 nm. Electrostatic manipulation of the lower gates 20 and 22 tunes the barriers on either side of the quantum dot, and this allows control of the tunnel rate across each barrier, as well as management of the interaction between electron occupancy and barrier transparency.

Electrical transport measurements were performed on several silicon quantum dots at the base temperature (~50 mK) of a dilution refrigerator, at an electron temperature of ~100 mK. Standard low-frequency lock-in techniques were used to measure the two-terminal conductance and differential conductance through the dot. Measurements were performed in zero applied magnetic field, and made using a lock-in AC excitation voltage of 100 μV. Each ohmic contact typically has a resistance of ~1 kÅ. The typical maximum mobility of similar MOSFET devices (5-nm SiO2, Al gate) is ~5000 cm$^2$/(V s) at 4 K.

Turn-On Characteristics

Figure 2A:
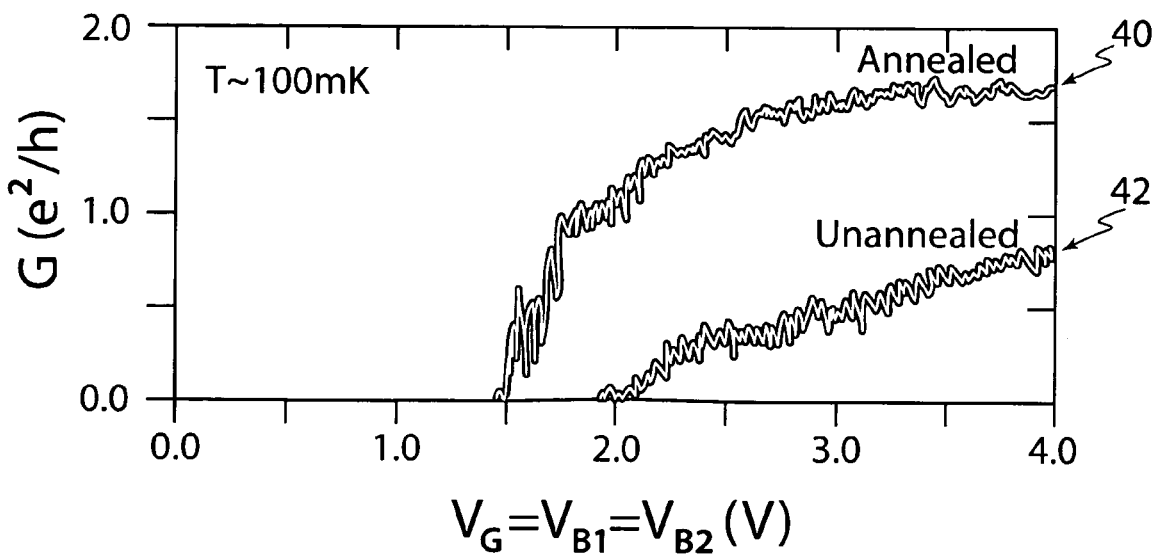
FIG. 2(a) is a graph comparing the turn-on characteristics of annealed and unannealed devices.

To measure the turn-on characteristic, a voltage was applied to all three gates simultaneously, $V_G$, $V_{B1}$ and $V_{B2}$, resulting in an approximately continuous field along the length of the nanowire 36. At 4 K, because of the high resistivity of the wafer, the source-drain conductance is zero until the applied gate voltage is equal to the threshold value. As the applied gate voltage is increased above the threshold value, the sourcedrain current increases smoothly toward a maximum conductance. At millikelvin temperatures, conductance fluctuations occur in the MOSFET like turn-on characteristic. As shown in FIG. 2(a), these fluctuations are reproducible over several sweeps of the voltage applied to all three gates.

A comparison is made between devices made in the same batch, but without the final forming gas anneal. The fluctuations in these samples were not reproducible over different sweeps and were time-dependent, which is consistent with switching events at the unannealed Si/SiO$_2$ interface or within the SiO$_2$. A forming gas anneal is well-established in standard Si MOSFETs for reducing the Si/SiO$_2$ interface trap density, and this result emphasizes the importance of this step for noise reduction in low-temperature measurements. This anneal also improved the performance of the samples by decreasing the threshold voltage, increasing the transconductance, and increasing the maximum conductance. Each of these effects is visible in the comparison of the annealed 40 and unannealed 42 samples in FIG. 2(a).

Conductance Characteristics

Figure 2B:
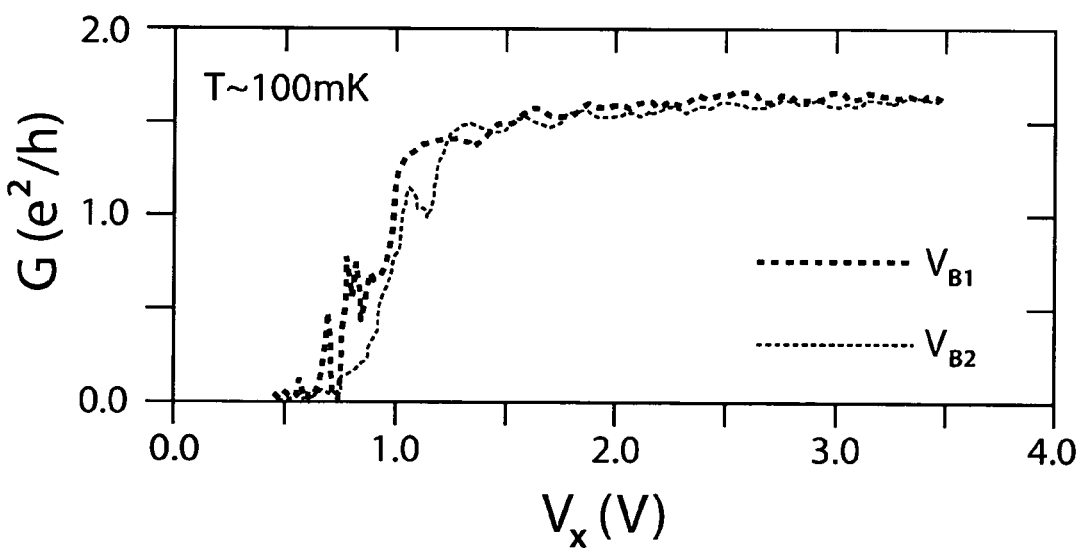
FIG. 2(b) is a graph of the conductance response of each barrier gate, measured while the upper gate and the other barrier gate were well above the threshold value at 3.5 V.

The conductance characteristic of each of the barrier gates is shown in FIG. 2(b). To isolate the effect of each barrier gate, these characteristics were measured with both the upper gate and the other respective barrier gate well above the threshold value. These results demonstrate that each of the lower gates may be used to tune its associated barrier from highly transparent (G>e2/h) to completely opaque (G=0). Some conductance fluctuations are observed in each barrier, which are probably due to variations in the potential and resonances in each barrier. At 4 K, these fluctuations are not observed; the source-drain conductance increases smoothly with the applied barrier gate voltage.

The barriers both have a steeper turn-on than the channel. Some resonances can be observed in each barrier.

Coulomb Blockade

Figure 3:
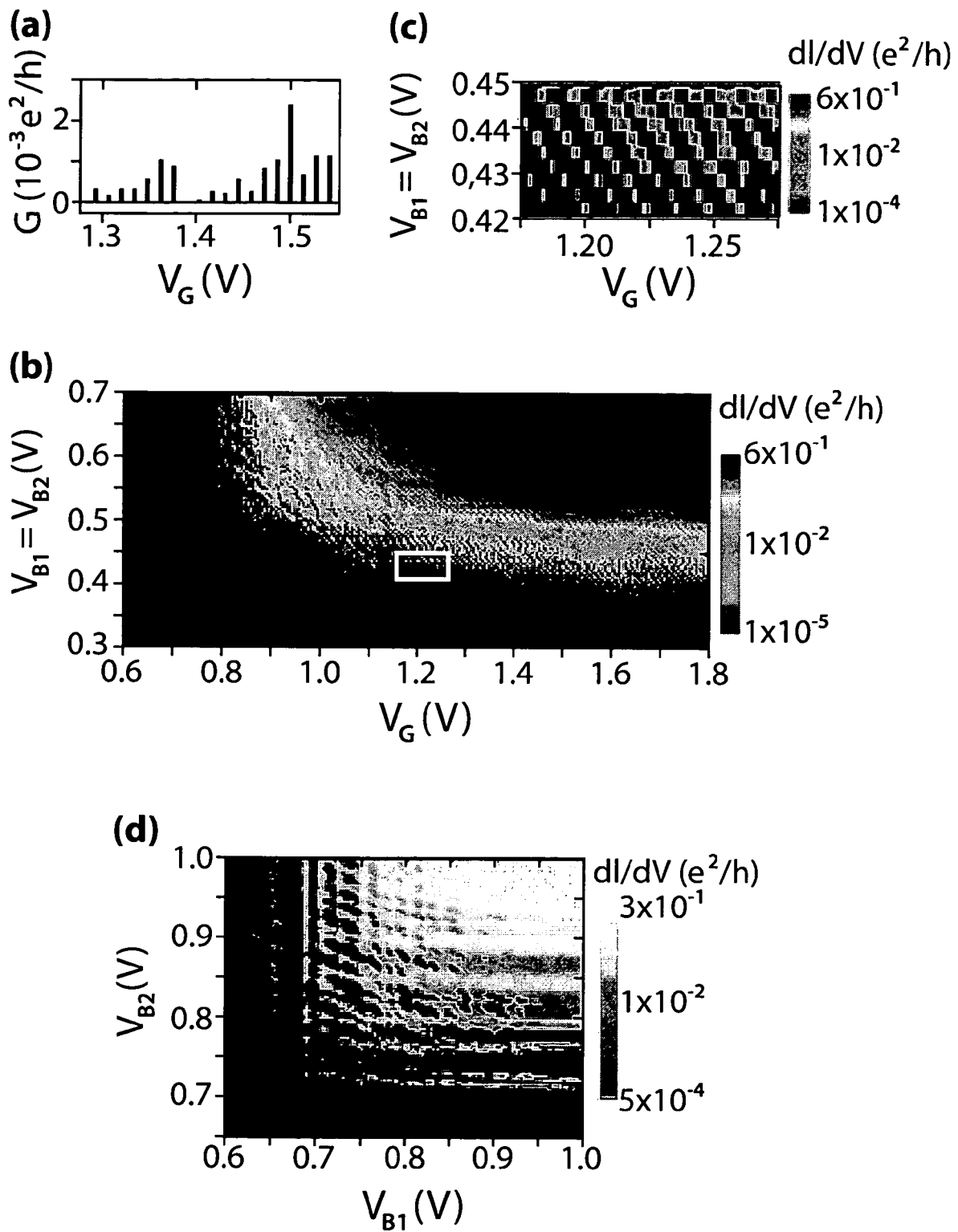
FIG. 3(a) is a graph showing a single trace at $V_{B1}$=0.43 V, $V_{B2}$=0.37 V, showing Coulomb blockade oscillations.
FIG. 3(b) is a graph showing differential conductance as a function of the upper gate $V_G$ and the barrier gates $V_{B1}$ and $V_{B2}$ while a constant source-drain bias of 1.5 mV was applied.
FIG. 3(c) is an enlarged section of (b) highlighting the diagonal lines of constant occupancy of the dot; the slope of these lines results from the capacitive coupling of the dot to both the upper gate $V_G$ and the barrier gates $V_{B1}$ and $V_{B2}$.
FIG. 3(d) is a graph showing the differential conductance as a function of each barrier gate voltage $V_{B1}$ and $V_{B2}$, at $V_G$=1.3 V, measured using a constant source-drain bias of 1.5 mV.

The combined effect of both the upper gate and the lower barrier gates on the source-drain conductance is illustrated in FIG. 3. The constant period and varying amplitude of the Coulomb oscillations, as shown in FIG. 3(a), are typical of transport through a semiconducting island and demonstrate resolvable quantum states in the island 36.

FIG. 3(b) displays the relationship between the upper and lower gates. The current through the device is zero when the applied gate voltage $V_G$ is below the threshold value, and also when opaque barriers are created by the lower gates 20 and 22. When the source-drain current through the device is non-zero, Coulomb blockade with constant period is observed over a large region, demonstrating that a single island is formed by the tunable tunnel barriers over a large range of applied biases. The fine diagonal lines in the plot, which are enlarged in FIG. 3(c) to be more easily visible, are resolvable quantum states and correspond to regions of constant electron occupancy of the dot.

The independent control of each barrier is demonstrated further in FIG. 3(d). Diagonal lines in the plot indicate Coulomb blockade that is equally coupled to each barrier gate and, therefore, is due to the central island. Also visible are vertical and horizontal lines, which are evidence of Coulomb blockade that is strongly coupled to the first and second barrier gates, respectively. The very small crosscoupling shown makes it likely that these resonances are due to the imperfect potential in each of the barriers.

Figure 4:
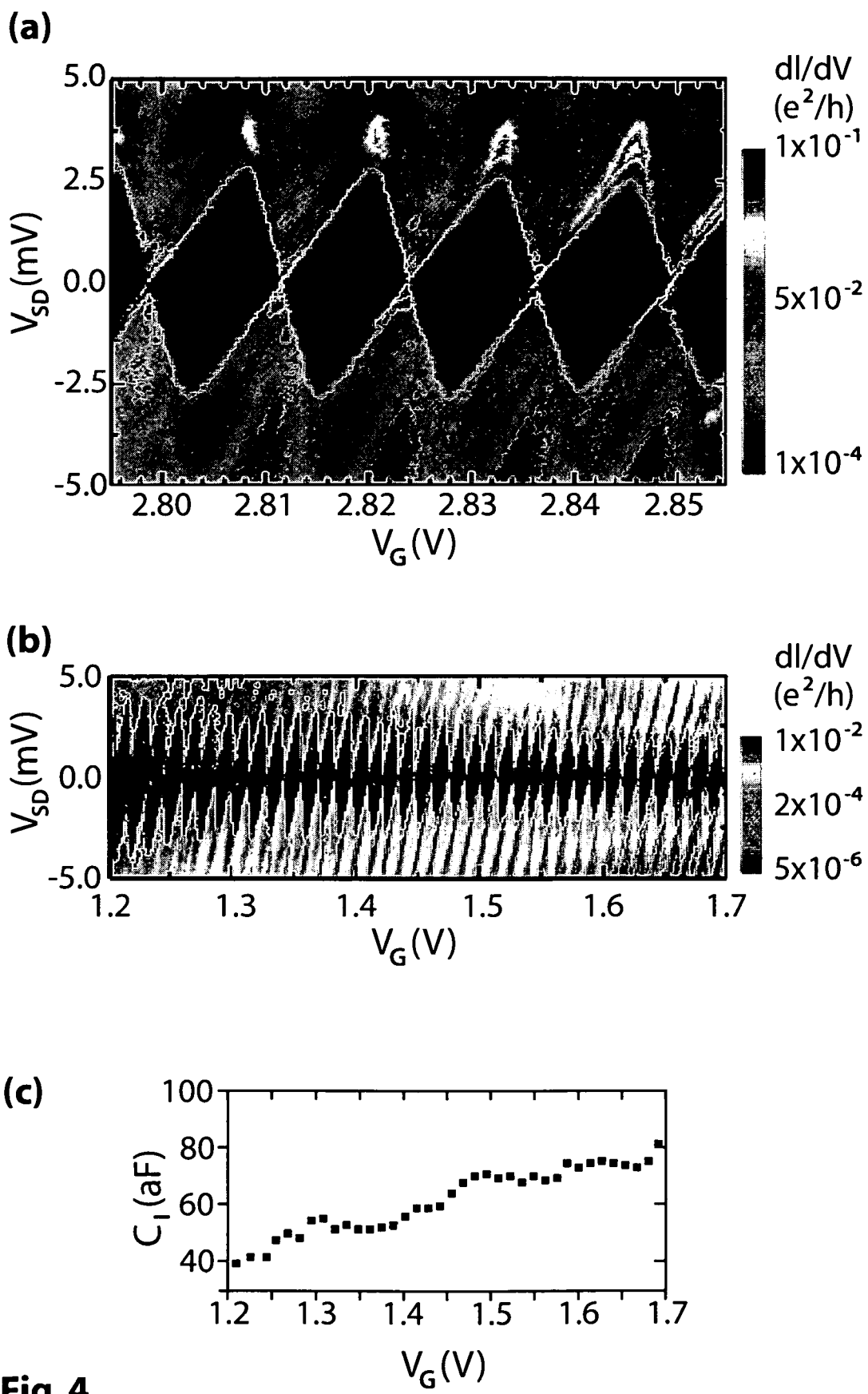
FIG. 4(a) is a bias spectroscopy image of a first sample, taken at $V_{B1}$=$V_{B2}$=0.85 V, with a lock-in AC excitation voltage of 20 îV, where N__100 electrons.
FIG. 4(b) is a bias spectroscopy image of a second sample taken at $V_{B1}$=0.43 V, $V_{B2}$=0.37 V, with a lock-in AC excitation voltage of 50 îV, and N__30 electrons on the left.
FIG. 4(c) is a graph showing total capacitance of the second sample, as a function of the applied gate voltage $V_G$.

Irregularities in the transport through the dot, as observed in FIG. 3(b), are likely to result from this same disorder in the barriers. We note that, in FIG. 3(d), there is some capacitive coupling between these barrier resonances and the central island, which may be suggestive of double dot charging. However, when the upper gate $V_G$ is used to probe the Coulomb diamonds, a constant Coulomb blockade period is observed over a wide range (for example, see FIG. 4(b)). This is indicative of a single dot in the centrally defined island.

The Many-Electron Regime

Various devices have been measured, with consistent results across different samples. FIGS. 4(a) and (b) show Coulomb diamonds belonging to two different samples. The first sample in FIG. 4(a) has a dot area of 30 nm×105 nm), and the second sample in FIG. 4(b) has a dot area of 35 nm×65 nm.

The dot in the first sample has a charging energy of $e^2/C_Å$) 2.5 meV. This gives a total capacitance value for the defined quantum dot of 64 aF, which is consistent with a simple parallel plate capacitance calculation of 61 aF, based on the lithographic dimensions of the dot, including the contribution of the barrier gates. The gate capacitance (determined by the period of oscillations) is determined to be 13 aF, which, again, is consistent with the parallel-plate capacitor estimation of 21 aF. The ratio of the gate capacitance to the total capacitance is É=$C_G/C_Å$=0.20.

The dot in sample 2 has a charging energy, $e^2/C_Å$, which increases from 2 meV to 4 meV, as the applied gate voltage, $V_G$, decreases. This charging energy is larger, which is consistent with the smaller dimensions of this device. The total capacitance determined from the charging energy is 40-80 aF, and this finding again agrees with the calculated capacitance of 41 aF. The total capacitance is approximately linearly dependent on the applied gate voltage $V_G$, as shown in FIG. 4(c), because the capacitance increases as the size of the dot increases. The gate capacitance is determined to be 12 aF, from the period of oscillations, which is consistent with the calculated value of 16 aF. The gate capacitance does not change significantly over the applied voltage range, presumably because, as the dot extends under the barrier gates, it is electrostatically screened from the applied MOSFET gate voltage. This results in a gate capacitance ratio of É=0.30 at $V_G$=1.2 V. The consistency of regular diamonds over such a large gate range confirms that this sample contains a single, electrostatically defined quantum dot, because multiple islands result in overlapping diamonds.

By varying the voltages applied to the upper gate and the lower gates, it is possible to measure transport through the quantum dot in different regimes: the upper gate $V_G$ is used to alter the number of electrons in the dot; and the lower barriers gates control the coupling between the dot and the leads. We estimated the number of electrons in the dot using two different methods. The first method used the period of Coulomb oscillations, which represents the addition of a single electron. The relative voltage applied to the top gate, with respect to the threshold voltage, is divided by the Coulomb oscillation period, giving an estimate of the number of electrons in the dot (assuming zero free electrons in the dot below the threshold voltage). The second method simply used the measured electron density of a similar device. Both methods give consistent estimates, within a few electrons. The number of electrons (N) in each of the dots shown is thus estimated to be N__100 in FIG. 4(*a*) and N__30 at the left of the long diamond sweep in FIG. 4(*b*).

The Few-Electron Regime

Figure 5:
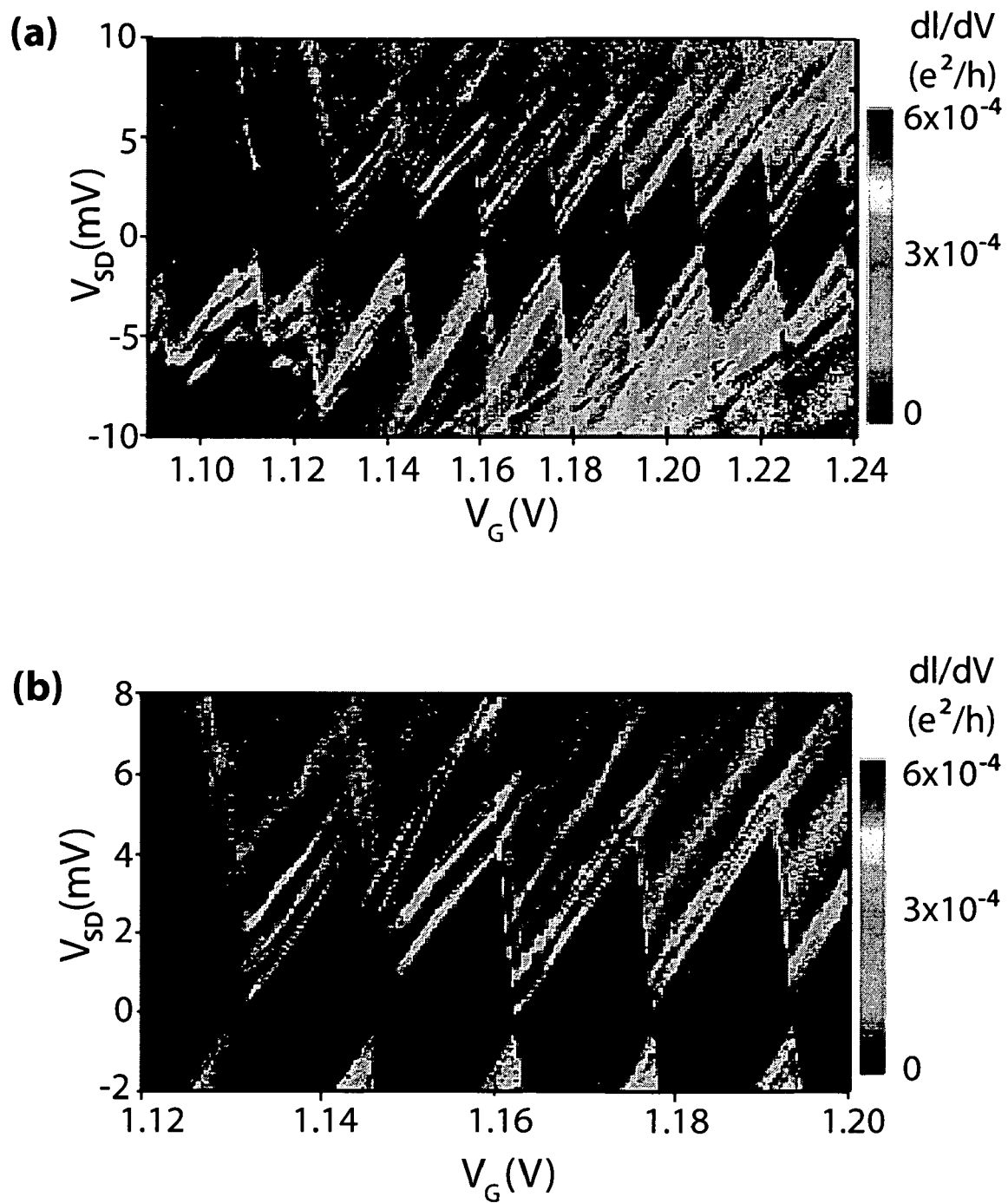
FIG. 5(a) is a bias spectroscopy image taken in the few-electron regime, where a lock-in excitation of 50 îV was used and the number of electrons was reduced by decreasing the voltage $V_G$ applied to the top gate until the Coulomb diamonds were the last visible.
FIG. 5(b) is an enlarged view where the lines of conductance parallel to the Coulomb diamond edges are evidence of excited states in the device.

To investigate transport phenomena in the few-electron regime, the applied gate bias $V_G$ was reduced to just above the threshold value. FIG. 5 shows data obtained with $V_G$=1.10 V, $V_1$=$V_2$=0.754 V, and we estimate N__10 electrons. There are indications of excited (quantum) states, shown in FIG. 5 by brighter lines of differential conductance parallel to the edges of the Coulomb diamonds outside of the blockaded region. These states become far more pronounced in the few-electron regime than in the many-electron regime; as observed in FIG. 5(*b*) in particular. The approximate energy level spacing in a two-dimensional (2D) dot can be calculated using $$\Delta E = \frac{2\pi \hbar^2}{gm*A}$$

where g is the degeneracy, m* the effective mass, and A the area of the dot. If both spin and valley degeneracies are included, then, E=275 μeV. Energy-level spacings up to 600 μeV are observed in FIG. 5, which is broadly consistent with the predicted value. In the few-electron regime, there are also many anomalies in the Coulomb diamonds, such as the gap in conductance near $V_{SD}$=0 mV and also the brighter lines of conductance that are not parallel to the diamonds. We understand that these are mostly likely due to imperfections in the barriers.

It is interesting to note several features: Significantly, the spacing of the excited states changes considerably for different electron occupancy of the dot, which is consistent with the excited states of a dot in the few-electron regime. States in the barriers or leads are expected to remain at a constant spacing over several diamonds. It is not clear whether the excited states of the dot are due to orbital excited states alone or whether there is also a splitting of the 2D valley degeneracy, as is anticipated in strongly confined 2D structures in silicon.

Radio Frequency Investigations

Figure 6:
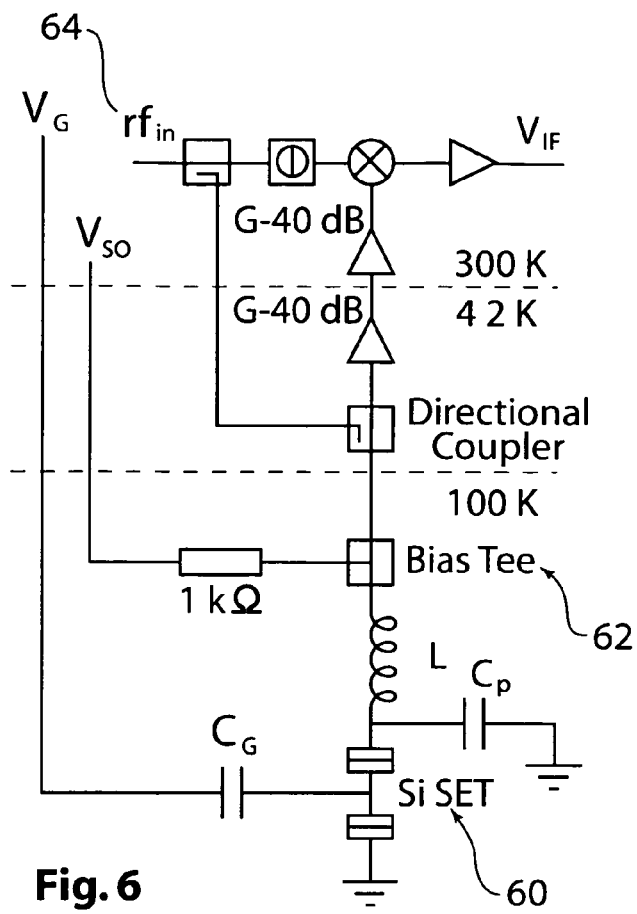
FIG. 6 is a schematic diagram of the rf-measurement set-up.

To this point the device has been considered with applied slowly varying DC voltages. Electrical transport measurements were performed at the base temperature (~100 MK) of a dilution refrigerator. As illustrated in FIG. 6, the silicon SET 60 was placed in an rf tank circuit 62, with an inductor L=470 nH and a parasitic capacitance, $C_P$, of approximately 450 fF. A DC source-drain bias was applied using a bias tee, with two-terminal DC conductance measurements performed using a standard low-frequency lock-in technique. Measurements were performed in zero applied magnetic field. An rf carrier signal 64 is applied to the source of the SET at the resonant frequency of the circuit (~340 MHz). The reflected power is mixed with the carrier frequency and measured using homodyne detection, as shown in FIG. 6.

IV Characteristic

In order to measure the IV characteristic, a voltage was applied to all three gates simultaneously, resulting in an approximately continuous potential along the length of the narrow channel. At 4K, due to the high resistivity of the wafer, the source-drain conductance is zero until the applied voltage is at the threshold value. As the gate voltage is increased above threshold, the source-drain current increases smoothly towards a maximum conductance; see FIG. 7(*a*).

Figure 7:
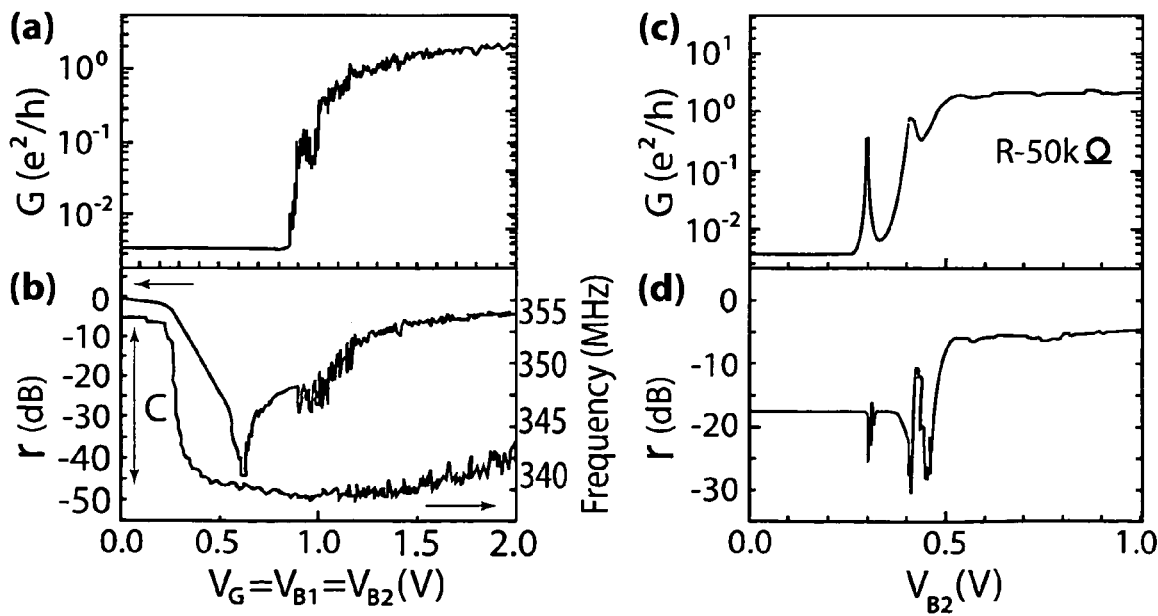
FIG. 7 are graphs of conductance and reflected power characteristics at T~100 mK. The reflected power has not been calibrated, and is a relative rather than absolute measure.

At millikelvin temperature, conductance fluctuations occur in the MOSFET IV characteristic, as seen in FIG. 7(*b*). The non-zero DC resistance below threshold ($3\times10^{-3}$) is due to limits of the measurement. The reflected rf-signal was also measured as a function of the voltage applied to all three gates, and as a function of frequency. The reflected rf-signal depends on the resistance of the SET, as described by the reflection coefficient, $$r = \frac{Z-50}{Z+50}$$

where $Z=L/(RC_P)$ is the impedance of the tank circuit including the SET resistance, R, at resonance. The resonant frequency is the frequency at which the minimum power is reflected. At an applied gate voltage well below the DC threshold value, there is a change in the resonant frequency, shown in FIG. 7(*b*). This change in frequency is equivalent to a change in the parasitic capacitance, $C_P$=40 fF. This frequency shift occurs at a voltage approximately equal to the threshold voltage in similar MOSFETs with much wider gates. This suggests that the 2DEG is induced under the wide area leads before DC conduction is possible in the narrow channel.

Conductance Characteristics

The conductance characteristic of one of the barrier gates is given in FIG. 7(*c*). In order to isolate the effect of each barrier gate, this characteristic was measured with both the upper gate and the other barrier gate well above threshold. The lower gates may be used to tune their associated barrier from highly transparent (G>e2/h) to completely opaque (G=0), as illustrated for Barrier 2 in FIG. 7(*c*). Barrier 1 displayed similar conductance and frequency characteristics. There is no significant shift in resonant frequency during the sweeps of each of the barrier gates. Resonances are observed during the sweep of each barrier gate potential. The matching resistance is observed to be approximately 50 k by correlating the DC resistance and the reflected rf-signal. It is interesting to note the asymmetry of the reflected power as a function of the applied barrier voltage. The reflected power is expected to approach zero as the resistance increases or decreases away from the matching resistance.

Coulomb Blockade

Figure 8:
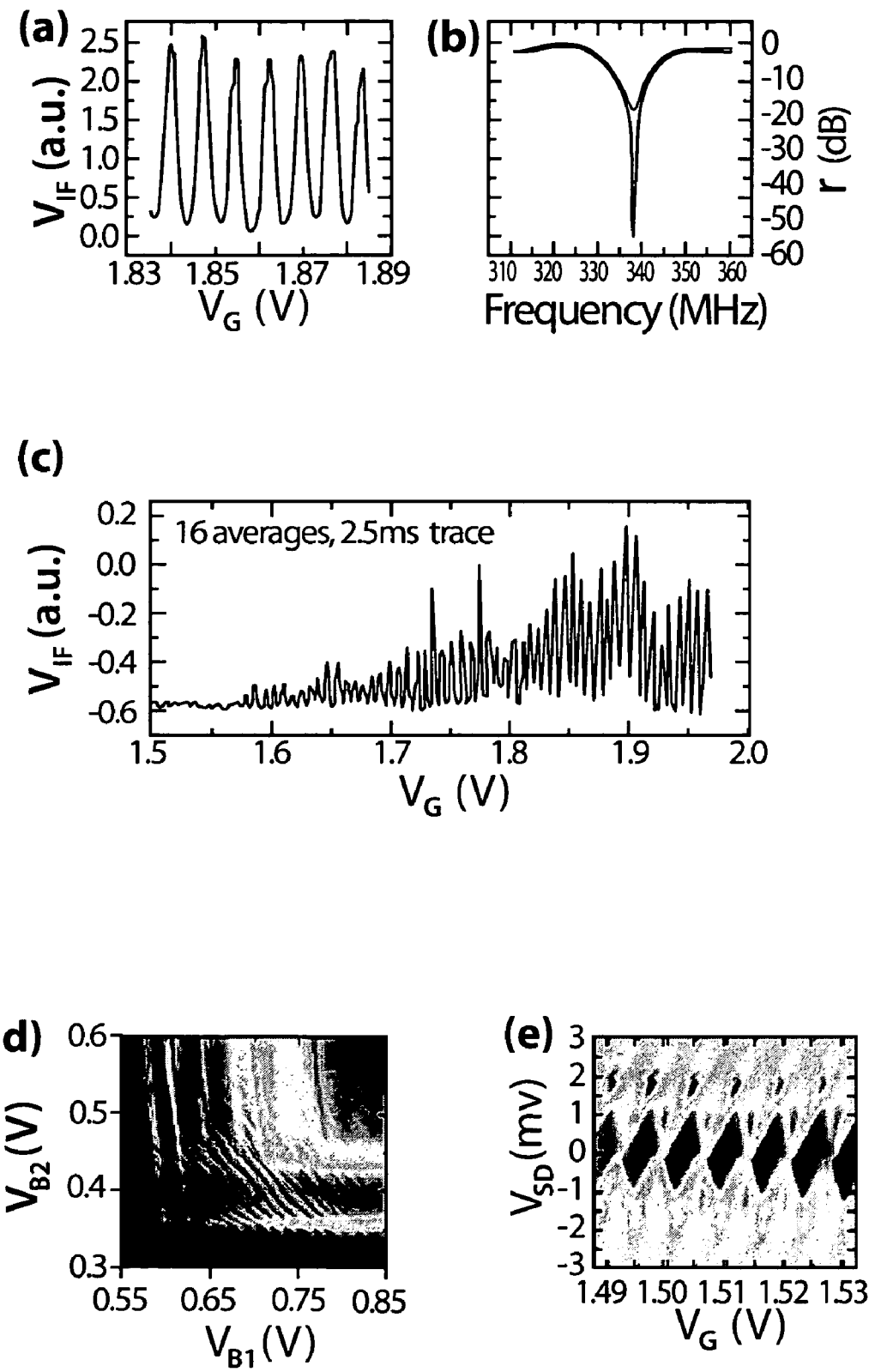
FIG. 8 are reflected power measurements demonstrating Coulomb blockade in the silicon SET. An rf carrier signal of 337 MHz or 334 MHz was used.

Coulomb blockade oscillations are observed over a large range of applied upper gate bias, $V_G$, as shown in FIG. 8(*c*) while the barrier gates are held at constant potential, $V_{B1}$=0.702 V, $V_{B2}$=0.478 V. The regular period is evidence that a single dot is formed in the Si SET. The increasing amplitude of the Coulomb blockade peaks is a result of the decreasing resistance of the SET as the upper gate bias is increased. We chose to operate the SET near $V_G$=2.0V due to the large difference in reflected power between the peak and trough of the Coulomb blockade oscillations at this voltage.

The independent control of each barrier is demonstrated in FIG. 8(*d*). The vertical and horizontal edges of the conducting region demonstrate that each barrier independently switches off the channel. The diagonal lines are Coulomb blockade oscillations exhibiting equal coupling to both barriers, indicating regions of constant occupancy in the central island. The vertical and horizontal lines result from blockade which couples only to $V_{B1}$ and $V_{B2}$ respectively and are evidence of disorder in each barrier.

Closed, periodic Coulomb diamonds are observed, as shown in FIG. 8(e). The measured charging energy, EC=e²/C_Σ is 1 meV. The measured charging energy is lower than the estimated charging energy EC=2 meV, based on a parallel plate calculation of the total capacitance. Charge noise was observed, causing shifts in the Coulomb diamonds. This noise was observed when the rf-signal was applied and also during DC measurements of the conductance.

Charge Sensitivity

The charge sensitivity of the silicon rf-SET was determined as a function of carrier frequency, carrier power, gate frequency and source-drain voltage. The charge sensitivity is measured by superimposing a small sinusoidal signal onto the DC gate voltage, with an rms amplitude equivalent to ~0.01 of an electron on the island. This results in amplitude modulation of the carrier signal. The resulting signal to noise ratio of the side-bands is then measured and the sensitivity is calculated using the expression:

$$\delta q = \frac{\Delta q_{rms}}{\sqrt{2B} \times 10^{SNR/20}}$$

Figure 9:
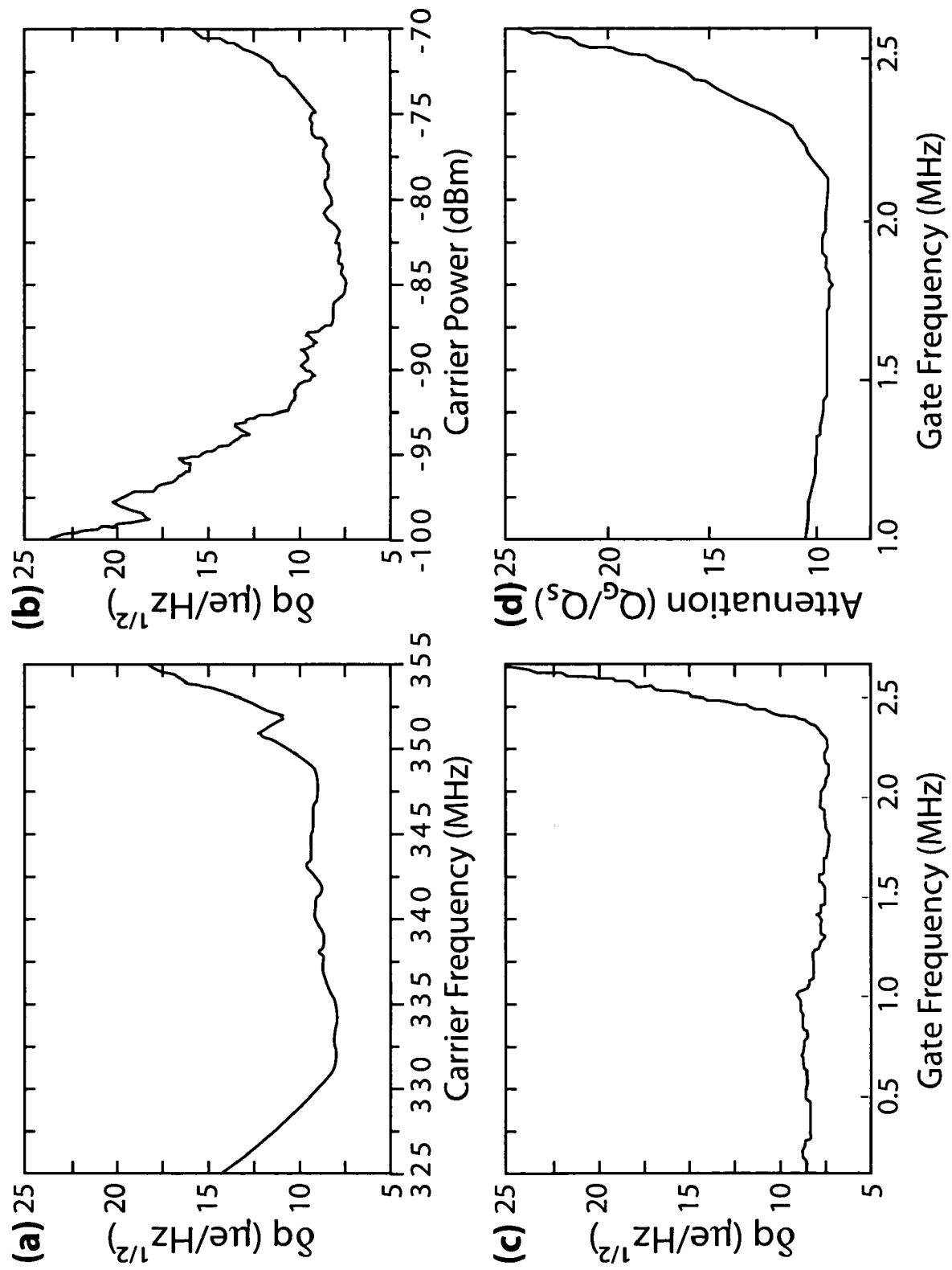
FIG. 9(a) is a graph of charge sensitivity, δq as a function of carrier frequency.
FIG. 9(b) is a graph of charge sensitivity, δq as a function of carrier power.
FIG. 9(c) is a graph of charge sensitivity, δq as a function of gate frequency.
FIG. 9(d) is a graph of attenuation of the applied gate signal as a function of gate frequency.

The best charge sensitivity was found to be êq=7.2 μe/√Hz, at zero source-drain bias. The 3 dB bandwidth of the resonant circuit is 15 MHz, as revealed by the relationship of the charge sensitivity to the frequency of the carrier signal, given in FIG. 9(a). The optimal carrier power for the best charge sensitivity depends on the charging energy of the SET. Since this SET has a larger charging energy than typical Al rf-SETs, it is possible to use a higher carrier power, as illustrated in FIG. 9(b).

The charge sensitivity increases sharply at a gate frequency of approximately 2.5 MHz. This cut-off frequency is consistent with the expected RC time constant of the high resistance gate contact in this sample. This is confirmed by increasing the amplitude of the sinusoidal signal on the gate over a range of frequencies. Since the SET resistance is non-linear, as the gate amplitude increases, more sidebands are visible in the demodulated signal. The magnitude of the nth sideband is given by the Bessel function $Jn((2\pi C_G V_G)/e)$. The zeroes of the first sideband reveal the attenuation of the gate signal, given in FIG. 9(d). The frequency at which the gate signal attenuation increases corresponds to the gate frequency at which the charge sensitivity also increases. This demonstrates that the bandwidth of this sample is not limited to 2.5 MHz by the Si SET, but by the high resistance gate contact.

Although the invention has been described with reference to a particular example, it should be appreciated that it could be exemplified in many other forms and in combination with other features not mentioned above. For instance, there are a number of ways by which the Si rf-SET may be improved. It is possible to increase the charging energy of the Si SET by decreasing the upper gate width and also by increasing the gate oxide thickness, in both cases thus decreasing the capacitance. An increased charging energy is expected to lead to both better charge sensitivity as well as a higher operating temperature. The lower gates may also be oxidised using other techniques, such as thermal oxidation or oxidation assisted by UV exposure.

REFERENCES (1) Elzerman, J. M.; Hanson, R.; Willems van Beveren, L. H.; Witkamp, B.; K. Vandersypen, L. M.; Kouwenhoven, L. P. *Nature* 2004, 430, 431.
(2) Petta, J. R.; Johnson, A. C.; Taylor, J. M.; Laird, E. A.; Yacoby, A.; Lukin, M. D.; Marcus, C. M.; Hanson, M. P.; Gossard, A. C. *Science* 2005, 309, 2180.
(3) Koppens, F. H. L.; Buizert, C.; Tielrooij, K. J.; Vink, I. T.; Nowack, K. C.; Meunier, T.; Kouwenhoven, L. P.; Vandersypen, L. M. K. *Nature* 2006, 442, 766.
(4) Biercuk, M. J.; Mason, N.; Marcus, C. M. *Nano Lett.* 2004, 4, 1.
(5) Sapmaz, S.; Meyer, C.; Beliczynski, P.; Jarillo-Herrero, P.; Kouwenhoven, L. P. *Nano Lett.* 2006, 6, 1350.
(6) Fasth, C.; Fuhrer, A.; Bjork, M. T.; Samuelson, L. *Nano Lett.* 2005, 5, 1487.
(7) Tahan, C.; Joynt, R. *Phys. ReV. B: Condens. Matter Mater. Phys.* 2005, 71, 075315.
(8) Klein, L. J.; Lewis, K. L. M.; Slinker, K. A.; Goswami, S.; van der Weide, D. W.; Blick, R. H.; Mooney, P. M.; Chu, J. O.; Coppersmith, S. N.; Friesen, M.; Eriksson, M. A. *J. Appl. Phys.* 2006, 99, 023509.
(9) Berer, T.; Pachinger, D.; Pillwein, G.; Muhlberger, M.; Lichtenberger, H.; Brunthaler, G.; Schaffler, F. *Appl. Phys. Lett.* 2006, 88, 162112.
(10) Sakr, M. R.; Jiang, H. W.; Yablonovitch, E.; Croke, E. T. *Appl. Phys. Lett.* 2005, 87, 223104.
(11) Klein, L. J.; Savage, D. E.; Eriksson, M. A. *Appl. Phys. Lett.* 2007, 90, 033103.
(12) Goswami, S.; Slinker, K. A.; Friesen, M.; McGuire, L. M.; Truitt, J. L.; Tahan, C.; Klein, L. J.; Chu, J. O.; Mooney, P. M.; van der Weide, D. W.; Joynt, R.; Coppersmith, S. N.; Eriksson, M. A. *Nat. Phys.* 2007, 3, 41.
(13) Hofheinz, M.; Jehl, X.; Sanquer, M.; Molas, G.; Vinet, M.; Deleonibus, S. *Appl. Phys. Lett.* 2006, 89, 143504.
(14) Rokhinson, L. P.; Guo, L. J.; Chou, S. Y.; Tsui, D. C. *Phys. ReV. B: Condens. Matter Mater. Phys.* 2001, 63, 035321.
(15) Saitoh, M.; Saito, T.; Inukai, T.; Hiramoto, T. *Appl. Phys. Lett.* 2001, 79, 2025.
(16) Zhong, Z. H.; Fang, Y.; Lu, W.; Lieber, C. M. *Nano Lett.* 2005, 5, 1143.
(17) Simmel, F.; Abusch-Magder, D.; Wharam, D. A.; Kastner, M. A.; Kotthaus, J. P. Phys. ReV. B: *Condens. Matter Mater. Phys.* 1999, 59, 10441.
(18) Jones, G. M.; Hu, B. H.; Yang, C. H.; Yang, M. J.; Hajdaj, R.; Hehein, G. *Appl. Phys. Lett.* 2006, 89, 073106.
(19) Fujiwara, A.; Inokawa, H.; Yamazaki, K.; Namatsu, H.; Takahashi, Y.; Zimmerman, N. M.; Martin, S. B. *Appl. Phys. Lett.* 2006, 88, 053121.

The invention claimed is:

1. A silicon integrated circuit device comprising:
a near intrinsic silicon substrate in which there are one or more ohmic contact regions;
an insulating layer above the substrate;
a lower layer of one or more aluminium gates on top of the insulating layer; and
an upper aluminium gate that extends over the lower gates; wherein the surface of each of the lower gates is oxidised to insulate them from the upper aluminium gate.

2. A silicon integrated circuit device according to claim 1, wherein the lower layer of one or more aluminium gates comprises two or more aluminium gates, and a quantum dot is created within the device, in a central island region between two of the aluminium gates.

3. A device according to claim 1, in combination with an rf tank circuit.

4. A device according to claim 1, wherein the ohmic contact regions are made by diffusing phosphorus dopants into the substrate.

5. A device according to claim 4, wherein the insulating layer is a 5 nm thick layer of SiO$_2$ gate oxide that is thermally grown on the surface of the substrate.

6. A device according to claim 5, wherein the two lower gates are aluminium fabricated using electron beam lithography (EBL), thermal evaporation and liftoff.

7. A device according to claim 6, wherein each of the lower gates is less than 30 nm wide, and the separation between them less than 40 nm.

8. A device according to claim 7, wherein the lower gates are partially oxidized using plasma oxidation technique to create insulating layers over their surfaces.

9. A device according to claim 8, wherein the surface insulating layer is less than about 10 nm thick.

10. A device according to claim 9, wherein the upper gate is aluminium, and it is aligned to the lower gates during a second EBL stage, and again thermally evaporated and lifted off.

11. A device according to claim 10, wherein the upper gate is between 50 nm and 100 nm wide.

12. A method for fabricating a silicon integrated circuit device, comprising the steps of:
preparing a near intrinsic, high resistivity, silicon substrate;
forming at least one ohmic contact region within the device;
thermally growing a layer of SiO$_2$ gate oxide on the substrate;
fabricating a layer of lower gates on top of the insulating oxide layer, using electron beam lithography (EBL), thermal evaporation and liftoff;
partially oxidising the lower gates using plasma oxidation technique to create insulating layers over their surfaces;
fabricating an upper gate over the channel and lower gates during a second EBL stage, with thermal evaporation and liftoff; and,
annealing the device.

* * * * *